(12) United States Patent
Saito

(10) Patent No.: US 6,784,655 B2
(45) Date of Patent: Aug. 31, 2004

(54) METHOD OF SETTING GRIBS AND/OR MARKERS IN MEASURING APPARATUS

(75) Inventor: Hiroki Saito, Tokyo (JP)

(73) Assignee: Ando Electric Co., Ltd., Tokyo (JP)

(*) Notice: Subject to any disclaimer, the term of this patent is extended or adjusted under 35 U.S.C. 154(b) by 32 days.

(21) Appl. No.: 10/113,607

(22) Filed: Apr. 1, 2002

(65) Prior Publication Data

US 2002/0140415 A1 Oct. 3, 2002

(30) Foreign Application Priority Data

Apr. 2, 2001 (JP) ..................................... P. 2001-103478

(51) Int. Cl.[7] ............................................. G01R 13/30
(52) U.S. Cl. .................................. 324/121 R; 315/377
(58) Field of Search .......................... 324/115, 121 R; 315/377; 345/440, 440.1, 800, 801

(56) References Cited

U.S. PATENT DOCUMENTS

| | | | | |
|---|---|---|---|---|
| 5,004,975 A | * | 4/1991 | Jordan | 324/121 R |
| 5,119,076 A | | 6/1992 | Wilson | 345/440.1 |
| 5,419,562 A | * | 5/1995 | Cromarty | 473/269 |
| 5,939,877 A | * | 8/1999 | Alexander | 324/121 R |
| 6,054,984 A | * | 4/2000 | Alexander | 345/771 |
| 6,366,689 B1 | * | 4/2002 | Rao et al. | 382/145 |
| 6,515,509 B1 | * | 2/2003 | Baxter | 326/39 |

* cited by examiner

Primary Examiner—Ernest Karlsen
(74) Attorney, Agent, or Firm—Fish & Richardson P.C.

(57) ABSTRACT

A method is provided of setting grids and/or markers on a screen of a display unit of a measuring apparatus. First, a mode of the apparatus is changed into a mode of setting the grids and/or the markers. Then, the grid and/or the marker serving as a reference is set. Then, a plurality of grids and/or markers are set, each of which provides an arbitrary interval with respect to the grid and/or the marker serving as reference.

6 Claims, 3 Drawing Sheets

METHOD OF SETTING GRIBS AND/OR MARKERS IN MEASURING APPARATUS

BACKGROUND OF THE INVENTION

1. Field of the Invention

The present invention relates to a measuring apparatus, such as an oscilloscope and a spectrum analyzer, for measuring a time characteristic and a frequency characteristic of an electrical signal and a frequency-dependent characteristic of an optical component.

2. Description of the Related Art

Generally, in a measurement using a measuring apparatus, such as an oscilloscope and a spectrum analyzer, for measuring a time characteristic and a frequency characteristic of an electrical signal and a frequency-dependent characteristic of an optical component, which apparatus is adapted to show a waveform indication representing a result of a measurement on a screen of a display unit, grids and markers are used in order to accurately know a result of a measurement performed at a certain point.

Grids in the measuring apparatus are lines for dividing an axis of ordinates and/or an axis of abscissas at predetermined intervals so as to facilitate the reading of a waveform that represents a result of a measurement by the reading apparatus and that is indicated on the screen of the display unit.

Further, markers are used for designating arbitrary positions on a waveform representing a result of a measurement, which is shown on the screen of the display unit, and for indicating the values of ordinates and/or abscissas of the positions.

Hitherto, measurement has been performed by indicating the grids and the markers together with a waveform, which represents a result of the measurement, on the screen of a display unit. According to a conventional method of setting a marker thereon, the marker can be moved by using a rotary knob or a cursor key. Moreover, the interval, by which the marker moves by 1 step, can be narrowed or broadened. However, the interval, by which the marker moves by 1 step, cannot be arbitrarily changed at each step.

Furthermore, according to a conventional method of setting the interval between grids, the interval therebetween is determined at a specific value but cannot be set at an arbitrary value.

The conventional methods of setting grids and/or markers cannot be applied to the case that it is continuously determined whether or not the quality of a signal source having an output, in which peak signals appear at predetermined wavelengths, is good, or whether or not the quality of a DUT (Device Under Test) having output spectra, in which absorption spectrum and transmission spectrum occur at predetermined wavelengths, is good, as illustrated in FIG. 1.

In the case that the moving interval of the marker is not equal to the interval between the peaks, as shown in FIG. 1, the conventional methods need to operate the rotary knob or the cursor key at each reading of a peak value to thereby move the marker so that the position of the marker coincides with the position corresponding to the peak value, and thereby compare the position, at which the signal is actually measured, with that, at which the signal originally should appear.

SUMMARY OF THE INVENTION

An object of the invention is to achieve easy determination and analysis of results of a measurement and to provide a method for arbitrarily change predetermined intervals between grids and predetermined moving interval of a marker on a screen of a display unit.

To achieve the foregoing object, according to an aspect of the invention, there is provided a method (hereunder referred to as a first method of the invention) of setting grids and/or markers on the screen of a display unit of a measuring apparatus, which comprises the steps of changing a mode of the apparatus into a mode of setting the grids and/or the markers, setting the grid and/or the marker serving as a reference, and setting a plurality of grids and/or markers, each of which provides an arbitrary interval with respect to the grid and/or the marker serving as the reference.

Incidentally, in the present specification, the expression "grids and/or markers" is used for indicating both the cases that only grids or only markers are set, and that both the grids and the markers are set.

Further, according to an example (hereunder referred to as a second method of the invention) of the first method of the invention, the step of setting a plurality of grids and/or markers, each of which provides an arbitrary interval with respect to the grid and/or the marker serving as the reference includes the step of designating positions of individual grids and/or markers by using a rotary knob or a cursor key. Thus, an operator can arbitrarily change the intervals between the grids and/or the interval between the markers on the screen of the display unit. Consequently, the determination and analysis of results of a measurement, which are displayed on the screen of the display unit, can easily be performed.

Moreover, according to another aspect of the invention, there is provided a method (hereunder referred to as a third method of the invention) of setting grids and/or markers on a screen of a display unit of a measuring apparatus, which comprises the steps of changing a mode of the apparatus into a mode of setting the grids and/or the markers, inputting data representing a setting range, in which grids and/or markers are set, on the screen of the display unit, and inputting a division number corresponding to the setting range, in which grids and/or markers are set. Thus, in the setting range, the grids and/or the markers can easily be set at equal intervals.

Further, according to an example (hereunder referred to as a fourth method of the invention) of the third method of the invention, the setting range is set over the entirety of the screen of the display unit. Thus, the grids and/or the markers can easily be set at equal intervals over the entire screen of the display unit.

Furthermore, according to an example (hereunder referred to a fifth method of the invention) of the third or fourth method of the invention, at the step of inputting data representing a setting range, in which grids and/or markers are set, on the screen of the display unit, the operator can designate the setting range by using a rotary knob or a cursor key.

Moreover, according to an example (hereunder referred to as a sixth method of the invention) of one of the third to fifth methods of the invention, at the step of inputting data representing a setting range, in which grids and/or markers are set, on the screen of the display unit includes the step of setting the data by inputting a numerical value from a ten key, and at the step of inputting a division number corresponding to the setting range, in which grid and/or markers are set, the division number can be set at a numerical value inputted from the ten key.

Furthermore, according to an example (hereunder referred to as a seventh method of the invention) of one of the first to sixth methods of the invention, the measuring apparatus is a spectrum analyzer indicating signal strength corresponding to a wavelength or a frequency. Thus, the determination and analysis of the result of the measurement, which is displayed on the screen of the display unit, can easily be performed.

DETAILED DESCRIPTION OF THE PRESENT INVENTION

The present invention will be described with reference to the accompanying drawings.

An example of indication of grids and a marker on the screen of a display unit is described hereinbelow.

Figure 1:
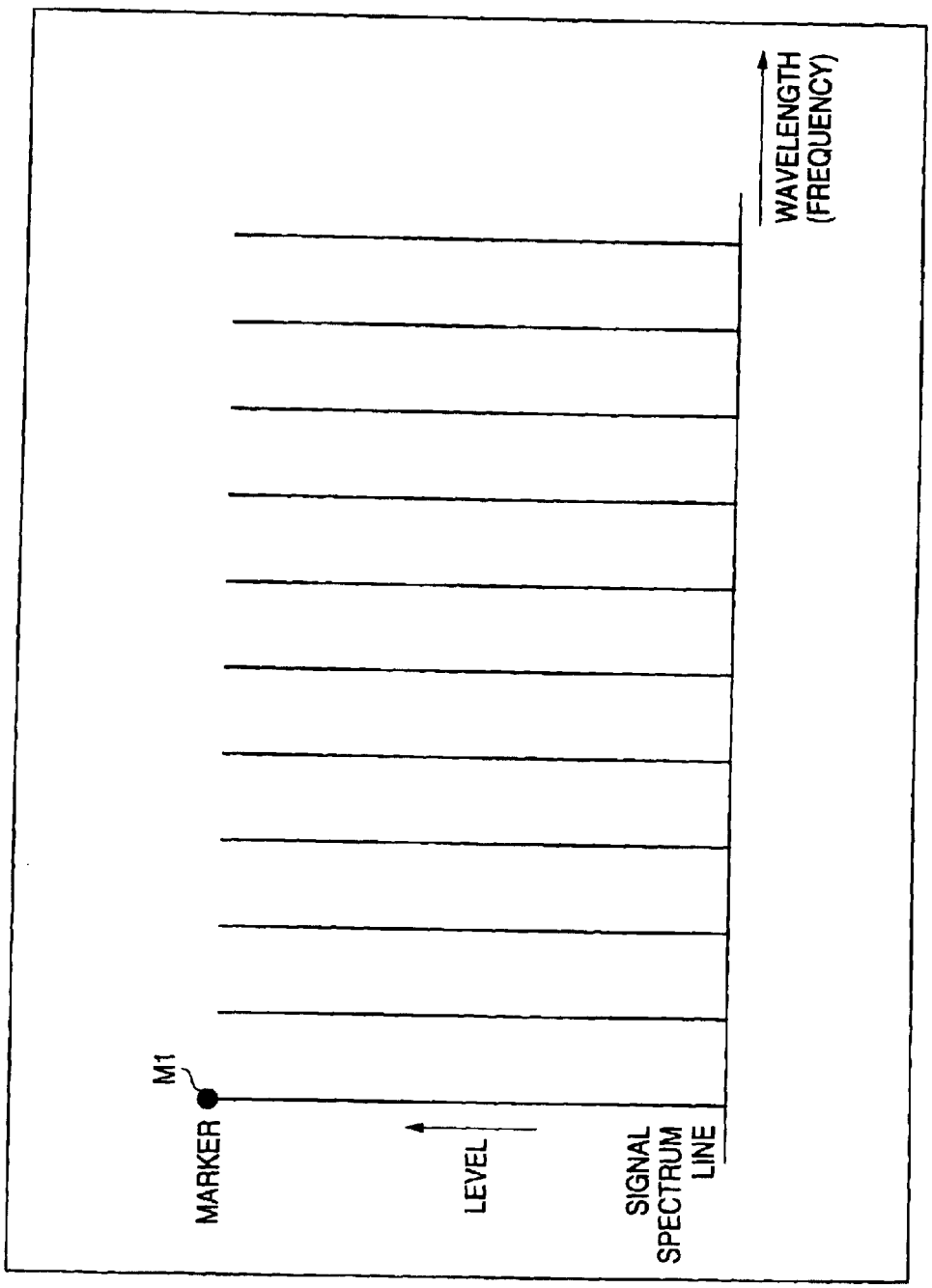
FIG. 1 shows a first example indicating grids and a marker in the indication of spectra representing a result of a measurement on the screen of a display unit.

FIG. 1 is a diagram showing an example of indication of spectra on the screen of the display unit in the case that it is continuously determined whether or not the equality of a signal source having an output, in which peak signals appear at predetermined wavelengths, is proper, or whether or not the quality of a DUT (Device Under Test) having output spectra, in which absorption spectrum and transmission spectrum occur at predetermined wavelengths, is proper.

In FIG. 1, an axis of abscissas designates a wavelength (or frequency) of a measured spectral signal, and an axis of ordinates denotes the signal level of each spectrum.

As shown in FIG. 1, a marker M1 is displayed at the peak of a first spectrum.

Further, the wavelength (or frequency) and the signal level corresponding to the value of the first peak can be read directly from the indication graduations of the screen of the display unit.

Incidentally, although not shown in FIG. 1, the wavelength (or frequency) and the signal level at the position, at which the marker is indicated, can be displayed on the screen of the display unit.

Further, to read the wavelength (or frequency) and the signal level of the second or following peaks, the marker is moved by being repeatedly shifted by a predetermined interval at a time because the peaks are displayed at equal intervals in the case illustrated in FIG. 1. Thus, the wavelength (or frequency) and the signal level corresponding to the peak at the position, to which the marker is moved, can be read.

Figure 2:
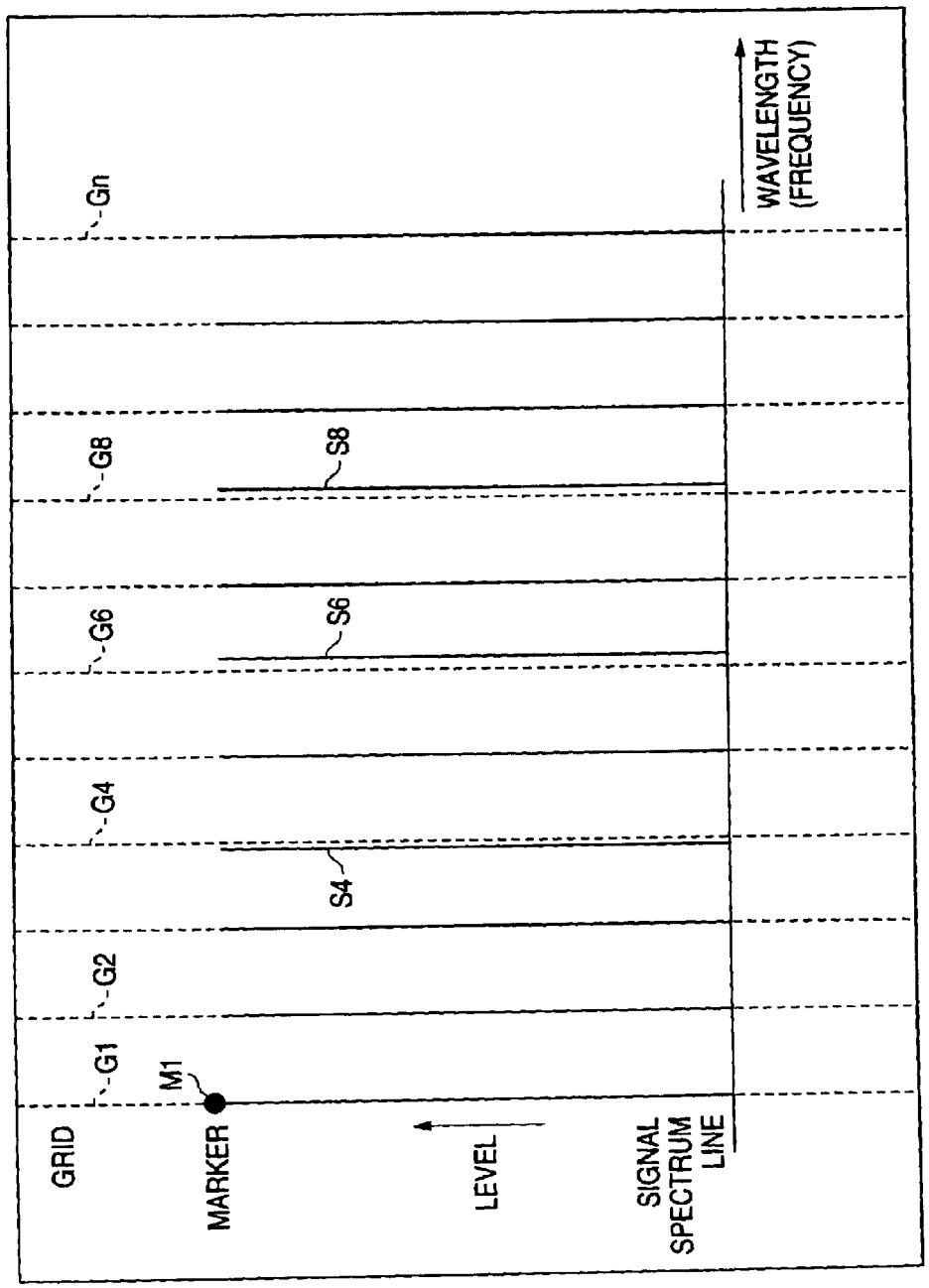
FIG. 2 shows a second example indicating grids and a marker in the indication of spectra representing a result of a measurement on the screen of a display unit.

FIG. 2 is a diagram showing another example indicating grids and a marker in the indication of spectra representing a result of a measurement on the screen of a display unit.

Further, in FIG. 2, a plurality of grids G1 to Gn are displayed at positions at which the peaks of the spectra corresponding to the absorption or transmission of the measured signal should appear.

Incidentally, although the grids and the marker are described so that each of the interval between the grids and the moving interval of the marker is constant, needless to say, the interval between the grids or the moving interval of the marker may be set in such a way as to differ from other intervals between the grids or other moving intervals of the marker.

As is understood from FIG. 2, it can easily and quickly be judged from the indication on the screen of the display unit that there is a deviation between the position of each of the peaks S4, S6, and S8, which have peak values, and that of a corresponding one of the grids G4, G6, and G8.

Further, regarding the reading of the wavelength (or frequency) and the signal level, which correspond to each of the peak values, similarly as in the case illustrated in FIG. 1, the wavelength (or frequency) and the signal level corresponding to a peak placed at the position, to which the marker is moved, can be read by moving the marker, which is placed at the position M1, by being repeatedly shifted by a predetermined interval at a time. (In the case that there is a deviation between the position, to which the marker is moved by being repeatedly shifted by a predetermined interval at a time, and the position of the peak having a corresponding peak value, the marker can be moved by operating the rotary knob or the cursor so that the position of the marker coincides with the position of the peak having the peak value.)

Incidentally, in the foregoing description, it has been described that when there is a deviation between the position, to which the marker is moved by being repeatedly shifted by a predetermined interval at a time, and the position of the peak having the corresponding peak value, the marker is moved by operating the rotary knob or the cursor so that the position of the marker coincides with the position of the peak having the peak value. Instead, the marker may be sequentially moved to the position of the peak, which has the corresponding peak value, by providing the apparatus with the function of automatically searching for the position of the peak having a peak value of the signal.

When the interval between the grids and the moving interval of the marker are set, values once set as the intervals can be utilized by storing the set values in storage means so as to set the interval between the grids and the moving interval of the marker later again.

Further, preliminary setting of a plurality of kinds of the interval between grids and the moving interval of a marker corresponding to a plurality of objects to be measured enables a user to save trouble in setting the interval between the grids and the moving interval of the marker at each measurement.

Figure 3:
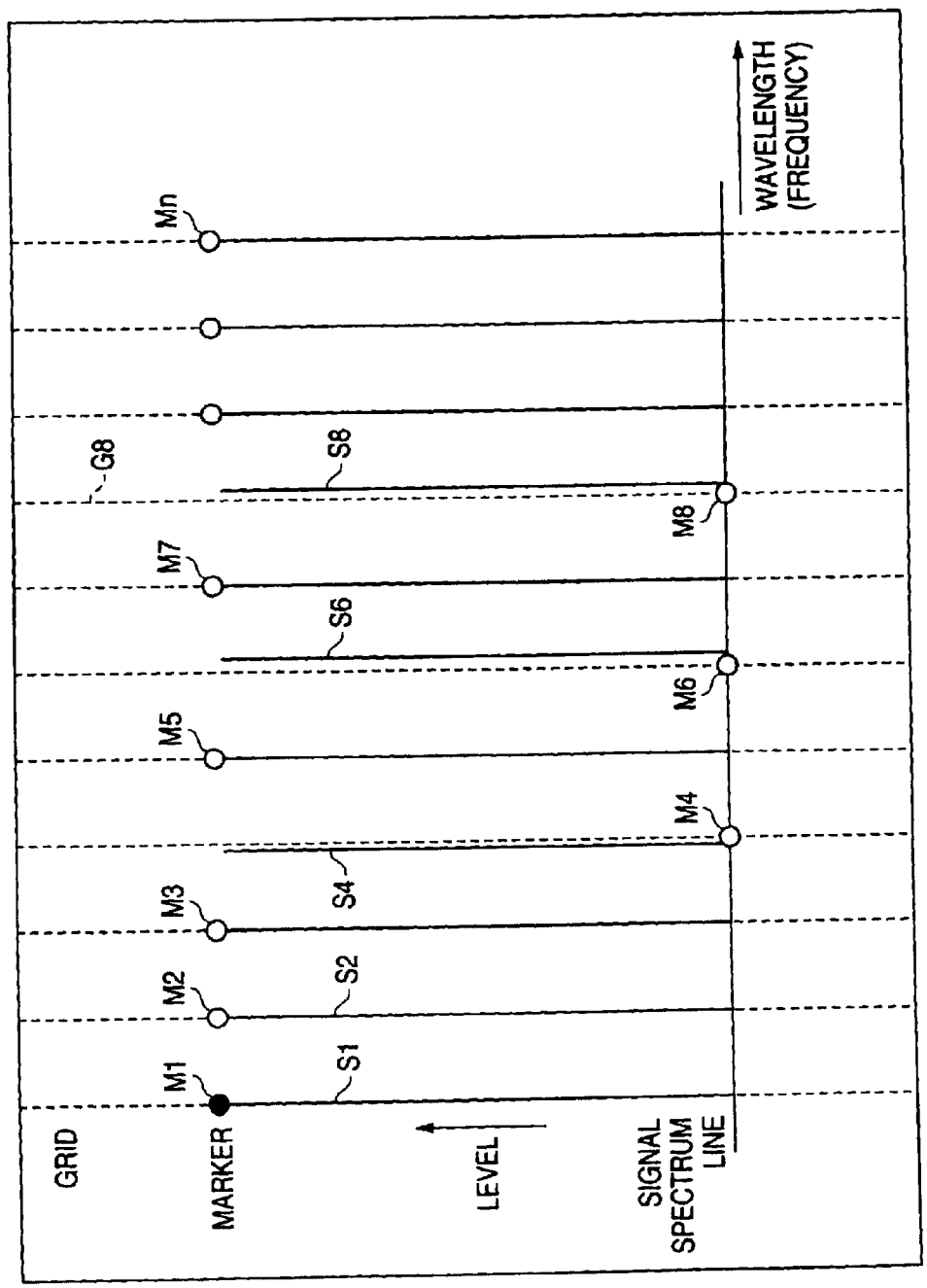
FIG. 3 shows a third example indicating grids and a marker in the indication of spectra representing a result of a measurement on the screen of a display unit.

FIG. 3 is a diagram showing another example indicating a plurality of grids and a plurality of markers, whose moving interval is equal to the interval between the grids, in the indication of spectra representing a result of a measurement on the screen of a display unit.

The plurality of markers M1 to Mn are shown at the positions, at which peak signals corresponding to a signal to be measured should appear, in this FIG. 3.

As is understood from FIG. 3, it can easily and quickly be judged from the indication on the screen of the display unit that there is a deviation between the position of each of the peaks S4, S6, and S8, which have peak values, and that of a corresponding one of the markers M4, M6, and M8.

Further, in this case, the difference in wavelength or frequency between the position of each of the markers, at which the peak signals should appear, and the position of a corresponding one of the peak values of the signal to be actually measured can be indicated on the screen of the display unit.

Incidentally, although the peak values of the measured signal are shown in FIG. 3, what are called "dips", that is, the minimum values thereof may be shown therein.

Putting the descriptions of FIGS. 1 to 3 together, the interval between the grids and the moving interval of the marker is set by performing the following methods:

First Setting Method (Method of Setting Grids and Markers at Arbitrary Intervals) comprising the processes of:

putting the apparatus into an optional setting mode at step a1;

indicating a setting grid (or marker) and moving the grid (or marker) to the next arbitrary grid position by using a rotary knob, a cursor key, or a ten key at step a2;

inputting the position of the grid (or marker) by pushing an Enter key at step a3;

repeatedly performing the processes, which are performed at the steps a2 and a3, on the grids (or markers), which are to be set, at step a4;

storing setting conditions, which are set at the aforementioned steps, in storage means at step a5; and canceling the setting mode of the grids and the markers at step a6.

A practical example is as follows:

(1) First, the apparatus is put into a condition setting mode in which the wavelength positions of the grids G1 to Gn are set at 1500, 1520, 1530, and 1550 nm, respectively, and in which the wavelength positions of the markers M1 to Mn are set at 1498, 1500, 1502, 1518, 1520, 1522, 1528, 1530, 1532, 1548, 1550, and 1552 nm (that is, the wavelength positions of the grids and these wavelength positions ±2 nm), respectively.

(2) Then, the setting conditions are stored in the storage means. Subsequently, the apparatus exits from the condition setting mode. Incidentally, a plurality of kinds of setting conditions may be stored therein.

(3) When the actually measured waveform is evaluated, the grids G1 to Gn are indicated at the set wavelengths on the screen of the display unit.

Further, the markers M1 to Mn are indicated at 1498 nm, 1500 nm, 1502 nm, . . . by moving the marker thereto one by one at each step of the cursor key or the rotary knob.

Incidentally, instead of indicating the markers M1 to Mn by being moved one by one at each step, all the markers may simultaneously be indicated.

Second Setting Method (Method of Setting Grids and Markers at Equal Intervals Only in Designated Range on Screen of Display Unit) comprising the processes of:

putting the apparatus into an equal interval setting mode at step b1;

setting a leftward and rightward range of the screen of the display unit at step b2;

setting an upward and downward range of the screen of the display unit at step b3;

setting a division number (or intervals) corresponding to the leftward and rightward range and a division number (or intervals) corresponding to the upward and downward range at step b4;

input the positions of the grids by pushing the Enter key at step b5;

storing setting-conditions set at the aforementioned step in storage means at step b6; and canceling the equal-interval setting mode at step b7.

Incidentally, the setting of the ranges at steps b2 and b3 may be inputted either by designating and entering numerical values directly from the ten key or by being designated on the screen of the display unit using the rotary knob or the cursor key.

Third Setting Method (Method of Setting Grids and Markers at Equal Intervals in the Entire Screen of Display Unit) comprising the processes of:

putting the apparatus into an equal interval setting mode at step c1;

setting a leftward and rightward range (or margin) of the screen of the display unit at 0 at step c2;

setting an upward and downward range (or margin) of the screen of the display unit at 0 at step b3;

setting a division number (or intervals) corresponding to the leftward and rightward range and a division number (or intervals) corresponding to the upward and downward range at step c4;

inputting the positions of the grids by pushing the Enter key at step c5;

storing setting-conditions set at the aforementioned step in storage means at step c6; and canceling the equal-interval setting mode at step b7.

Incidentally, when initial values are 0 at steps c2 and c3, the process at step c4 can be performed without performing the processes at steps c2 and c3.

According to the methods of the invention, time taken to move the marker can considerably be reduced by preliminary setting the position, to which the marker is moved, at a (wavelength or frequency) position corresponding to an object to be measured, at which a measurement is performed.

In the case of the conventional apparatus, the larger the number of measuring points, the longer time it takes to move the marker. However, according to the method of the invention, the position, to which the marker is moved, is preliminary set. Thus, the marker is permitted to quickly skip to an arbitrary position independent of the number of measuring points.

Further, according to the method of the invention, the number of and the interval between the grids can be arbitrarily set. Thus, the method of the invention can easily cope with the case that an object to be measured is changed.

Furthermore, even in the case of a measuring apparatus, such as a spectrum analyzer or an optical spectrum analyzer, enabled to designate a measuring range, an optimum arrangement of grids can easily be set by increasing or decreasing the interval between the grids only in a specific range correspondingly to the measuring range.

Moreover, the list display of the deviation between the grid (or marker) and the peak (or "dip") of the actually measured signal is achieved according to the invention. Thus, the determination and analysis of the quality of characteristics of an object to be measured can easily be performed.

Further, it can be determined and analyzed by fixing the grid interval and shifting the overall grids whether or not the characteristics of the object to be measured are shifted by equal intervals, and whether or not the characteristics of the object are partly shifted.

Furthermore, it is possible to measure the signal levels at the positions of the markers, which are shifted by predetermined amounts when the position of the peak having a peak value coincides with the position of the grid, by setting a plurality of markers on the lateral sides of the position of the specific grid (or marker), that is, at the wavelength or frequency positions shifted in positive and negative directions from the specific grid (or marker) by the predetermined amounts.

Therefore, analysis of a cross stroke between adjacent grids can easily be performed in units of grids.

Further, the wavelength interval, at which optical signals are multiplexed according to WDM transmission techniques employed in an optical communication system, is prescribed according to ITU-T standards. The characteristics of a wavelength division multiplexing signal and an optical device are repeatedly exhibited along each ITU-T channel.

Thus, the methods of the invention are suited to an optical spectrum analyzer, an optical wavemeter, and an optical component tester.

In this case, the analysis of wavelength characteristics of wavelength division signals, to which ITU-T standards are applied, can easily be performed by preliminary setting the grid interval in such a manner as to meet ITU-T standards.

According to the invention, there is provided the first method of setting grids and/or markers on the screen of a display unit of a measuring apparatus, which comprises the steps of changing a mode of the apparatus into a mode of setting the grids and/or the markers, setting the grid and/or the marker serving as a reference, and setting a plurality of grids and/or markers, each of which provides an arbitrary interval with respect to the grid and/or the marker serving as the reference. Thus, the intervals between the grids and/or the interval between the markers can arbitrarily be changed. Consequently, the determination and analysis of results of a measurement, which are displayed on the screen of the display unit, can easily be performed.

Further, according to the second method of the invention, at the step of setting a plurality of grids and/or markers, each of which provides an arbitrary interval with respect to the grid and/or the marker serving as the reference, the positions of individual grids and/or markers are designated by using a rotary knob or a cursor key. Thus, an operator can arbitrarily change the intervals between the grids and/or the interval between the markers on the screen of the display unit. Consequently, the determination and analysis of results of a measurement, which are displayed on the screen of the display unit, can easily be performed.

According to the invention, there is provided the third method of setting grids and/or markers on a screen of a display unit of a measuring apparatus, which comprises the steps of changing a mode of the apparatus into a mode of setting the grids and/or the markers, inputting data representing a setting range, in which grids and/or markers are set, on the screen of the display unit, and inputting a division number corresponding to the setting range, in which grid and/or markers are set. Thus, in the set range, the grids and/or the markers can easily be set at equal intervals.

Further, according to the fourth method of the invention, the setting range is set over the entirety of the screen of the display unit. Thus, the grids and/or the markers can easily be set at equal intervals over the entire screen of the display unit.

Furthermore, according to the fifth method of the invention, at the step of inputting data representing a setting range, in which grids and/or markers are set, on the screen of the display unit, the operator can designate the setting range by using a rotary knob or a cursor key.

Moreover, according to the sixth method of the invention, at the step of inputting data representing a setting range, in which grids and/or markers are set, on the screen of the display unit, the data maybe set by inputting a numerical value from a ten key, and at the step of inputting a division number corresponding to the setting range, in which grids and/or markers are set, the division number can be set at a numerical value inputted from the ten key.

Furthermore, according to the seventh method of the invention, in the case that the measuring apparatus is a spectrum analyzer indicating signal strength corresponding to a wavelength or a frequency, the determination and analysis of the result of the measurement, which is displayed on the screen of the display unit, can easily be performed.

What is claimed is:

1. A method of setting grid lines and markers on a screen of a display unit of a measuring apparatus, the method comprising the steps of:

changing a mode of the apparatus into a mode of setting grid lines and markers;

setting a first grid line and first marker serving as a reference;

setting a plurality of second grid lines and second markers, each of which provides an arbitrary interval with respect to the first grid line and the first marker serving as the reference; and displaying the set first and second grid lines and the first and second markers on the screen of the display unit.

2. The method according to claim 1, wherein the step of setting a plurality of second grid lines and second markers includes designating positions of the second grid lines and second markers by using a rotary knob or a cursor key.

3. The method according to claim 1, wherein the measuring apparatus is a spectrum analyzer indicating signal strength corresponding to a wavelength or a frequency.

4. A method of setting grid lines and markers on a screen of a display unit of a measuring apparatus, the method comprising:

setting a first grid line and first marker serving as a reference;

setting a plurality of second grid lines and second markers, each of which provides an arbitrary interval with respect to the first grid line and the first marker serving as the reference; and displaying the set first and second grid lines and the first and second markers on the screen of the display unit.

5. The method according to claim 4, further comprising:

measuring wavelengths of a waveform; and displaying a result of the measurement including displaying the first and second grid lines associated with wavelengths of the waveform.

6. The method of according to claim 4, wherein the measuring apparatus is a spectrum analyzer indicating signal strength corresponding to a wavelength or a frequency.

\* \* \* \* \*